(12) United States Patent
Siddiqui

(10) Patent No.: US 8,302,053 B2
(45) Date of Patent: Oct. 30, 2012

(54) AUTOMATED INTEGRATED CIRCUIT CLOCK INSERTION

(75) Inventor: Khalil Siddiqui, San Jose, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 410 days.

(21) Appl. No.: 12/711,651

(22) Filed: Feb. 24, 2010

(65) Prior Publication Data

US 2011/0209111 A1    Aug. 25, 2011

(51) Int. Cl.
*G06F 17/50* (2006.01)
(52) U.S. Cl. ......... 716/113; 716/126; 716/132; 716/136
(58) Field of Classification Search .................. 716/113, 716/126, 132, 136
See application file for complete search history.

(56) References Cited

U.S. PATENT DOCUMENTS

| | | | | |
|---|---|---|---|---|
| 6,020,774 | A | 2/2000 | Chiu et al. | 327/295 |
| 7,248,635 | B1 * | 7/2007 | Arneson et al. | 375/257 |
| 7,831,946 | B2 * | 11/2010 | Dennis et al. | 716/113 |

OTHER PUBLICATIONS

"Clock Distribution Network—Wikipedia, the free encyclopedia"; http://en.wikipedia.org/wiki/Clock_distribution network, Dec. 29, 2009, 3 pages.
Devulapalli, Mallik et al., "Clock Mesh Variation Robustness: Benefits and Analysis"; http://www.design-reuse.com/articles/?id=210198&print=yes, Jan. 26, 2010 (Print date), 4 pages.
"Clock Rate—Wikipedia, the free encyclopedia"; http://en.wikipedia.org/wiki/Clock_rate, Jan. 23, 2010, 3 pages.
"Clock Signal—Wikipedia, the free encyclopedia"; http://en.wikipedia.org/wiki/Clock_signal, Dec. 29, 2009, 3 pages.
"Delay Calculation—Wikipedia, the free encyclopedia"; http://en.wikipedia.org/wiki/Delay_Calculation, Jun. 29, 2009, 3 pages.
"Electronic Design Automation—Wikipedia, the free encyclopedia"; http://en.wikipedia.org/wiki/Electronic_design_automation, Jan. 27, 2010, 7 pages.
"Fan-Out—Wikipedia, the free encyclopedia"; http://en.wikipedia.org/wiki/Fanout, Nov. 20, 2009, 3 pages.
"Integrated Circuit Design—Wikipedia, the free encyclopedia"; http://en.wikipedia.org/wiki/Integrated_circuit_design, Dec. 9, 2009, 5 pages.

(Continued)

*Primary Examiner* — Thuan Do
(74) *Attorney, Agent, or Firm* — Harrity & Harrity, LLP

(57) ABSTRACT

A user device receives a request to perform an automatic clock insertion operation for an integrated circuit; retrieves location information regarding a group of components, of the integrated circuit, that use a clock signal; deploys a clock mesh based on the location information regarding the group of components; and inserts drop points into the clock mesh; deploys a particular buffer for a particular drop point; maps a component, of the group of components, to the particular buffer; generates a clock box for the particular buffer, where dimensions of the clock box are based on a location of the component; deploys an H-tree for the clock box, where dimensions of the H-tree are proportional to the clock box dimensions; connects the H-tree to the component; and displays or stores clock mesh information, information regarding the group of buffers, information regarding the H-tree, and the location information regarding the group of components.

20 Claims, 11 Drawing Sheets

OTHER PUBLICATIONS

"Place and route—Wikipedia, the free encyclopedia"; http://en.wikipedia.org/wiki/Place_and_route, Apr. 8, 2009, 2 pages.

Tsai, Jeng-Liang., "Clock Tree Synthesis for Timing Convergence and Timing Yield Improvement in Nanometer Technologies", University of Wisconsin-Madison, 2005, 123 pages.

Kurokawa, Keiichi et al., "A Practical Clock Tree Synthesis for Semi-Synchronous Circuits", IEICE Trans. Fundamentals, vol. E84-A, No. 11, Nov. 2001, pp. 2705-2713.

Millman, Jacob et al., "Microelectronics: 2nd Edition", McGraw Hill 1987, pp. 23-26.

* cited by examiner

US 8,302,053 B2

AUTOMATED INTEGRATED CIRCUIT CLOCK INSERTION

BACKGROUND

As the number of components and new technologies that are incorporated into integrated circuits (ICs) continues to increase, the complexity of IC designs and the density of components fabricated into today's IC chips continue to increase. Some of today's large ICs have over one billion transistors, installed on a chip of approximately 300 square millimeters, with component densities exceeding one million transistors per square millimeter. Client demands challenge designers to find new ways to come up with faster and more capable IC devices that require increasingly complicated IC designs. Additionally, market pressures further challenge designers to rapidly develop new and more complicated IC designs that can be fabricated in a cost effective manner while also meeting customer requirements. Unfortunately, despite the complexity of today's ICs, not all of the IC design process is automated and thus must still be performed manually.

SUMMARY

According to one aspect, a method may be performed by a user device. The method may include receiving a request to perform an automatic clock insertion operation for an integrated circuit; retrieving, in response to the request, location information associated with a group of components, of the integrated circuit, that use a clock signal input; deploying a clock mesh based on the location information associated with the group of components; inserting one or more drop points associated with the clock mesh; deploying a particular clock buffer, of a group of clock buffers, for each of the one or more drop points; mapping each of one or more components, of the group of components, to the particular clock buffer, of the group of clock buffers; generating a clock box for the particular clock buffer, where dimensions of the clock box may be based on the location information regarding the one or more components; deploying an H-tree associated with the clock box, where dimensions of the H-tree may be proportional to the clock box dimensions; connecting the H-tree to the one or more components; and displaying or storing information associated with the clock mesh, information associated with the group of clock buffers, information associated with the H-tree, and the location information associated with the group of components.

According to another aspect, a user device may include a memory configured to store location information associated with a group of components of an integrated circuit, and a processor. The processor may be configured to receive a request to perform an automatic clock insertion operation for the integrated circuit; retrieve, in response to the request, the location information associated with the group of components, of the integrated circuit, that use a clock signal input; install a clock mesh based on the location information associated with the group of components, where the clock mesh may include one or more drop points; insert a particular clock buffer for a particular drop point of the one or more drop points; associate one or more components, of the group of components, where the particular clock buffer may be based on the location information associated with the one or more components; generate a clock box for the particular clock buffer, where dimensions of the clock box may be based on the location information corresponding to one or more components; insert an H-tree associated with the clock box, where dimensions of the H-tree may be proportional to the clock box dimensions; route wires between the H-tree and the one or more components; and display or store information associated with the clock mesh, information associated with the particular clock buffer, information associated with the H-tree, and the location information associated with the group of components.

According to yet another aspect, a system may include one or more user devices to store location information associated with a group of components of an integrated circuit. The one or more user devices may include means for receiving a request to perform an automated clock insertion operation for the integrated circuit; means for retrieving location information associated with the group of components, of the integrated circuit, that use a clock signal input; means for deploying a clock mesh based on the location information associated with the group of components, where the clock mesh may include one or more drop points; means for performing a clock buffer seeding operation, in which a particular clock buffer, of a group of clock buffers, may be inserted for each of the one or more drop points; means for logically mapping one or more components, of the group of components, to the particular clock buffer based on a determination that the particular clock buffer may be a closest clock buffer of the group of clock buffers; means for generating a clock box for the particular clock buffer based on location information associated with the one or more components; means for deploying an H-tree for the particular clock buffer, where dimensions of the H-tree may be determined based on a proportion of a dimension of the clock box, the proportion may be specified by a user of the one or more user devices; means for connecting the one or more components to the H-tree; and means for displaying or storing information associated with the clock mesh, information associated with the group of clock buffers, information associated with the H-tree, and the location information associated with the group of components.

DETAILED DESCRIPTION

Figure 1:
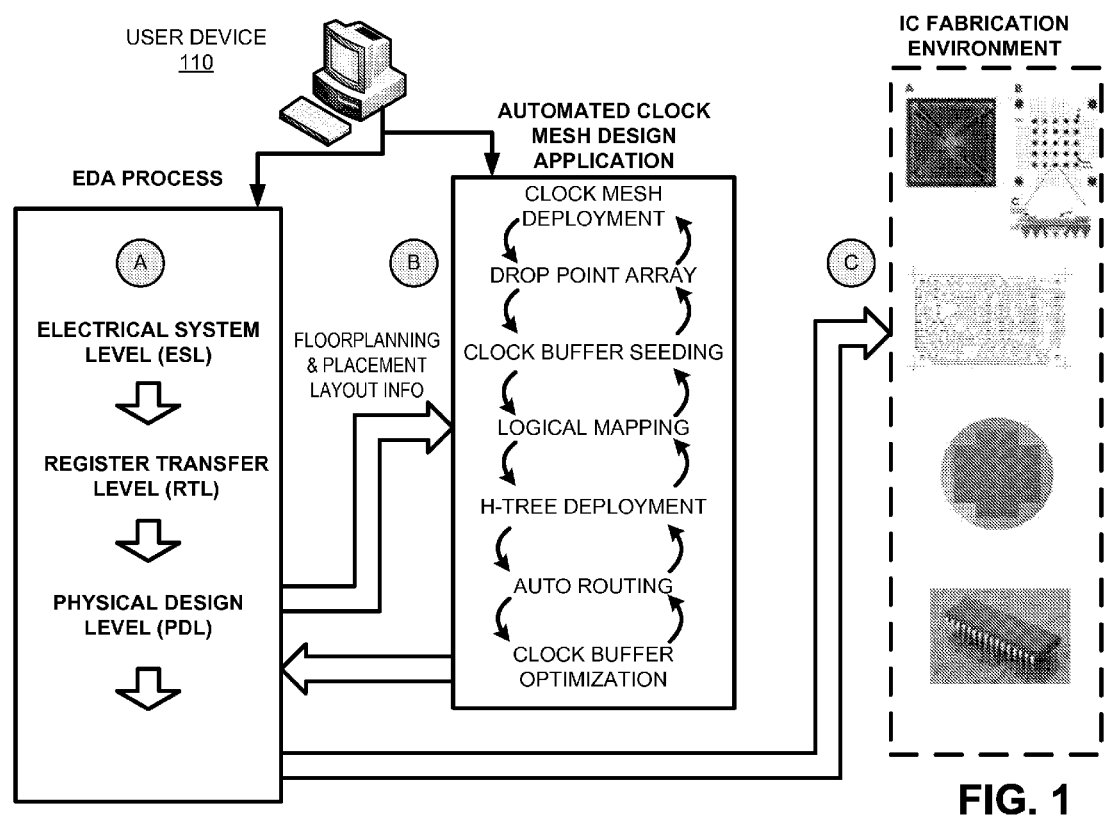
FIG. 1 is a diagram of an overview of an automated integrated circuit clock insertion implementation described herein.

The following detailed description refers to the accompanying drawings. The same reference numbers in different drawings may identify the same or similar elements. Also, the following detailed description does not limit the invention.

An implementation described herein may include systems and/or methods that provide for an automated integrated circuit clock insertion using a technique that can automate a clock insertion operation, within an integrated circuit (IC) design process, to reduce or eliminate clock skew and/or clock latency within an IC. Additionally, or alternatively, the automated IC clock insertion may reduce the time to design, to troubleshoot, and/or to perform design revisions, associated with clock distribution within an IC, which may reduce the cost associated with IC design, development, and/or fabrication.

As described herein, a clock mesh may be utilized to reduce the clock skew and/or clock latency in an IC. More particularly, distributing a clock signal via a clock mesh may enable differences in arrival time (e.g., clock skew), among IC components requiring a clock signal input, to be managed and/or reduced. Additionally, or alternatively, the delay associated the clock signal arrival times (e.g., clock latency) may be reduced by using a clock mesh. Arrival time may be defined as the time it takes for the clock signal to travel from the clock source, associated with a particular IC via a particular wire or set of wires (e.g., a clock mesh or some other form of clock distribution network), to a particular component in the particular IC (e.g., as usually measured at the rising edge and/or the falling edge of the clock signal, such as a square wave or some other waveform).

As further described herein, an automated clock insertion design application (hereinafter referred to as the "design application") may be hosted by a user device and may accept input from the user and/or other devices, may perform operations based on the input received, and/or may provide output in the form of displaying information, sending notifications, sending information to another device (e.g., another user device, an IC manufacturing device, etc.) and/or storing information.

As one example, the design application may automatically generate a clock mesh overlay for an IC undergoing design and/or may enable an array of drop points to be extended from the clock mesh, through an insulation layer, and into IC blocks and/or near IC components installed on an IC chip (e.g., a monolithic substrate, such as a semiconductor material or some other material, on which the IC is to be fabricated). The drop point array may be "seeded" with local clock buffers (e.g., or some other delay device, such as an inverter, etc.) by connecting clock buffers to each drop point associated with the drop point array.

A logical mapping operation may be performed where each IC component, within a particular IC block, that requires clock signal inputs, may be associated with the closest clock buffer in the proximity of each particular IC component. As a result of the logical mapping operation, the design application may automatically deploy an H-tree topology into the IC design by connecting an appropriately dimensioned H-tree to each clock buffer within the buffer topology. The design application may communicate with a placement and routing tool (hereinafter referred to as "PNR tool") to perform an automatic routing operation in which each IC component may be connected, via a wire, to an H-tree associated with a clock buffer to which an IC component is logically mapped. The design application may compute the resulting electrical input parameters (e.g., resistance, capacitance, etc.) for each H-tree and the components connected to the H-tree (e.g., fanout) and may revise the buffer size and/or characteristics associated with a particular H-tree and/or the fanout associated with the H-tree. The design application may automatically output the clock distribution network information to the user, the PNR tool, an IC manufacturing device and/or may store the clock distribution network information in a memory.

The term "integrated circuit" (IC), as used herein, may refer to a microprocessor, a field programmable gate array (FPGA), a printed circuit board, an application specific integrated circuit (ASIC), and/or a memory device (e.g., random access memory (RAM), read only memory (ROM), flash memory, etc.) and may sometimes be referred to as a "chip" or "IC chip." Furthermore, the term "component," as used herein, may refer to any IC component, circuit and/or element that requires a clock signal input to function properly within an IC.

Exemplary System Overview

FIG. 1 is a diagram of an overview of an automated IC clock insertion implementation described herein. As shown in FIG. 1, a user device (e.g., user device 110) may store one or more applications associated with IC design, and may store a design application associated with an automated IC clock insertion implementation described herein.

User device 110 may include one or more computation or communication devices, that gather, process, search, store, and/or provide information in a manner similar to that described herein. User device 110 may be a computer device, a mobile computing device (e.g. a laptop computer) and/or another computation or communication device. As shown in FIG. 1, user device 110 may interface with an IC fabrication environment and may perform operations associated with IC design and/or IC fabrication as described herein. In another implementation, user device 110 may interface with other user devices 110 to perform operations associated with IC design and/or IC fabrication. The description to follow will generally refer to user device 110 as a computer device; however, the description is not limited to a computer device and may equally apply to other types of user devices.

User device 110 may host a design application and/or other IC design tools, such as design tools (e.g., PNR tools, register transfer level tools, static timing analysis tools, etc.) associated with the electronic design automation process (hereinafter referred to as the "EDA process"). The design application and/or other IC design tools, associated with the EDA process, may generate IC design information, which user device 110 may send to the IC fabrication environment.

The EDA process may include an electrical system level (ESL) phase, a register transfer level (RTL) phase, a physical design level (PDL) phase, and/or other phases (indication A). While FIG. 1 illustrates the EDA process as including the ESL phase, the RTL phase, and the PDL phase, in other implementations, fewer phases, different phases, additional phases or differently arranged phases may be associated with the EDA process.

One or more EDA phases may include a number of design stages and/or operations that may be performed automatically (e.g., by a design automation tool), heuristically (e.g., based on designer experience, empirical methods, and/or designer judgment) and/or manually. The ESL phase may include receiving customer requirements and generating a specification for an IC that addresses the customer requirements. The RTL phase may include developing, from the specification, a logical description of the operation and/or behavior of the IC that can, at a later point, be implemented by hardware components and/or software. Additionally, or alternatively, an RTL description may describe how signals within the IC travel between registers and/or other IC components to execute the logical description.

The PDL phase may include a number of design stages that generate an IC design that can be fabricated and/or that can execute the RTL logical description in conformance with the specification. For example, the PDL phase may include a floorplanning stage, a logic synthesis stage, a placement stage, a clock insertion stage, a routing stage, etc. The floorplanning stage may include dividing the chip into regions and/or a set of blocks in which various IC components may be placed to execute the RTL (e.g., I/O pads, arrays, central processing units (CPUs), logic circuits, memory components, registers, etc.). The logic synthesis stage may include generating a gate-level netlist of components that may execute the operations required by the RTL. The placement stage may include generating placement layout information corresponding to the specific location that logic gates and/or other components, identified in the netlist, may be integrated into IC blocks and/or regions defined in the floorplanning stage. The placement layout information may include component location information that may minimize wire length, temperature gradients and/or power consumption associated with components installed in the IC.

The clock insertion stage may include a number of operations that enable the insertion of a clock distribution network, within the IC, in a manner that minimizes clock skew and/or clock latency. The clock distribution network may include a clock mesh, a clock mesh buffer, local clock buffers, H-trees and/or routing wires to connect components identified in the placement layout information, to the H-tree so that clock signal inputs may be received. The clock insertion stage will be further discussed below.

The routing stage may include inserting wires to interconnect the logic gates, identified in the netlist, located in an IC block, and/or located on the IC chip, with components installed during the floorplanning stage. Care may be taken during the routing stage to ensure that the routing can be reproduced in the fabrication environment.

While the PDL phase is described above as including a floorplanning stage, a logic synthesis stage, a placement stage, a clock insertion stage, and a routing stage, in other implementations, fewer stages, different stages, additional stages or differently arranged stages may be associated with the PDL phase. Additionally, or alternatively, the manner in which the design stages, associated with the PDL phase, are performed may, in other implementations, be modified from that discussed herein. For example, the order of the design stages may be changed, the execution of one or more operations may be repeated, one or more design stages may not be executed, and/or one or more design stages may be performed in an iterative manner.

Returning to the clock insertion stage, a number of operations, associated with generating a clock distribution network, may be performed that minimize clock skew and/or clock latency associated with the IC undergoing design. For example, as illustrated in FIG. 1, a design application may perform, and/or enable a user to perform, a clock mesh deployment operation, a drop point array operation, a clock buffer seeding operation, a logical mapping operation, an H-tree deployment operation, an automatic routing operation and/or a clock buffer optimization operation (indication B).

A clock mesh deployment operation and a drop point array operation may be performed. For example, using the placement layout information generated during the placement stage of the PDL phase, the design application may determine the component density for the entire area of the chip, for a particular region of the chip and/or for a block installed on the chip. Based on the component density information, the design application may generate a clock mesh overlay (e.g., a conductive grid of wires and/or some other pattern of wires) with a particular grid pattern and/or density that may enable a clock signal to be uniformly distributed in close proximity to most or all of the components (e.g., components requiring a clock signal input) to be installed on the chip to minimize clock skew and/or clock latency. Furthermore, based on the clock mesh and/or component density information, the design application may generate a drop point array in which conductive contacts, connected to a wire of the clock mesh, are inserted into an IC block and/or in the proximity of each component, at a controlled and/or uniform interval, along the clock mesh wire.

An automatic clock buffer seeding operation may be performed. For example, the design application may automatically seed the drop point array by connecting a local clock buffer to each drop point of the drop point array. The local clock buffer may be an inverter device or another device that causes the incident clock signal to be delayed by a predetermined amount of time to reduce skew within the IC and ensure that a synchronous clock signal is communicated to the components within the IC. For example, components requiring a clock signal input that are in close proximity to the clock source and/or a nearest drop point may require a particular amount of delay in the clock signal, which determines the size of the articular local clock buffer. However, components requiring a clock signal input that are farther away from the clock source and/or the nearest drop point may require less delay (e.g., and thus, a local clock buffer that is smaller than the particular local clock buffer) due to the additional time required for the clock signal to reach the more distant components.

A logical mapping operation may be performed. For example, the design application may logically map each component, requiring a clock signal input, to the nearest local clock buffer and may generate clock boxes of appropriate size for each local clock buffer based on the logical mapping.

An H-tree deployment operation and an automatic routing operation may be performed. For example, using the logical mapping information (e.g., local clock buffer location, clock box dimensions, etc.), the design application may generate an H-tree topology in which an H-tree is connected to the output of each clock buffer within the IC. The H-tree may be a thick conductive H-shaped wire with negligible delay characteristics that may be sized in proportion to the clock box to which it corresponds.

An automatic routing operation may be performed. For example, the design application and/or another design tool (e.g., a PNR tool) may connect, via routing wires, IC components, that were logically mapped to a particular local clock buffer, to an H-tree that may be connected to the particular local clock buffer.

A clock buffer optimization operation may be performed. For example, the design application may compute the input electrical characteristics (e.g., resistance, capacitance, etc.) for each H-tree and the fanout corresponding to each H-tree (e.g., the IC components connected to each H-tree) and may resize the local clock buffer to ensure that the appropriate amount of delay is inserted into the clock signal to minimize clock skew and/or clock latency associated with the IC components connected to the particular H-tree.

The IC design may be sent to the fabrication environment. For example, a routing stage may be performed, by a design tool associate with the EDA process (e.g., a PNR tool and/or some other design tool), to connect the logic gates to components to be installed on the IC. The IC design information may be sent, by user device 110, to an IC fabrication environment (indication C). In the fabrication environment, the components, gates, wires, blocks, etc. may be fabricated onto a monolithic substrate (e.g., usually a semiconductor chip made of silicon, germanium or gallium arsenide substrate) usually through a photolithography process and/or other processes. The fabrication environment may produce an IC, installed on a chip. Verification testing may be performed to determine that the chip is performing in accordance with the specification (e.g., clock skew, clock latency, chip speed, etc.).

While FIG. 1 illustrates the clock insertion stage as including a clock mesh deployment operation, a drop point array operation, a clock buffer seeding operation, a logical mapping operation, an H-tree generation operation, an automatic routing operation and a clock buffer optimization operation, in other implementations, fewer operations, different operations, additional operations or differently arranged operations may be associated with the clock insertion stage. Furthermore, the manner in which the operations are performed may, in other implementations, be modified from that discussed herein. For example, the order of the operations may be changed, performance of one or more operations may be repeated, one or more operations may not be performed, and/or one or more operations may be performed in an iterative manner.

Exemplary User Device Elements

Figure 2:
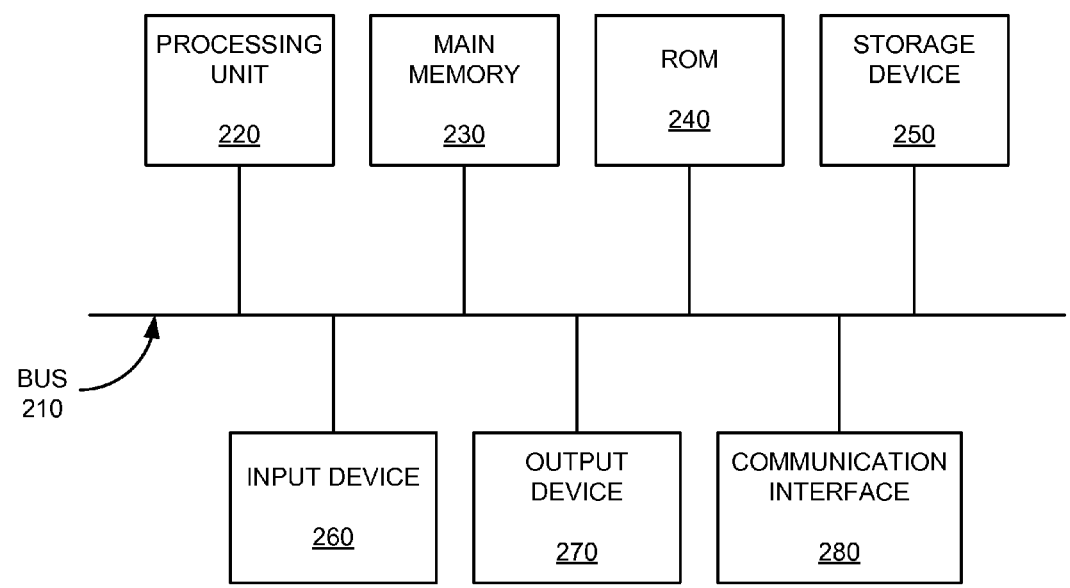
FIG. 2 is a diagram of exemplary components of the user device of FIG. 1.

FIG. 2 is a diagram of exemplary elements of user device 110. As illustrated, user device 110 may include a bus 210, a processing unit 220, a main memory 230, a read-only memory (ROM) 240, a storage device 250, an input device 260, an output device 270, and/or a communication interface 280. Bus 210 may include a path that permits communication among the components of user device 110.

Processing unit 220 may include a processor, a microprocessor, an application-specific integrated circuit (ASIC), a field programmable gate array (FPGA), or another type of processing unit that may interpret and execute instructions. Main memory 230 may include a RAM or another type of dynamic storage device that may store information and instructions for execution by processing unit 220. ROM 240 may include a ROM device or another type of static storage device that may store static information and/or instructions for use by processing unit 220. Storage device 250 may include a magnetic and/or optical recording medium and its corresponding drive, or a type of flash memory.

Input device 260 may include a mechanism that permits a user to input information into user device 110, such as a keyboard, a mouse, a pen, a button, voice recognition and/or biometric mechanisms, a touch screen, etc. Output device 270 may include a mechanism that outputs information to the user, such as a display, a speaker, a light emitting diode (LED), etc. Communication interface 280 may include any transceiver-like mechanism that enables user device 110 to communicate with other devices and/or systems via wireless communications (e.g., radio frequency, infrared, and/or visual optics, etc.), wired communications (e.g., conductive wire, twisted pair cable, coaxial cable, transmission line, fiber optic cable, and/or waveguide, etc.), or a combination of wireless and wired communications.

As described herein, user device 110 may perform certain operations in response to processing unit 220 executing software instructions contained in a computer-readable medium, such as main memory 230. A computer-readable medium may be defined as a physical or logical memory device. A logical memory device may include space within a single physical memory device or spread across multiple physical memory devices. The software instructions may be read into main memory 230 from another computer-readable medium, such as storage device 250, or from another device via communication interface 280. The software instructions contained in main memory 230 may cause processing unit 220 to perform processes described herein. Alternatively, hardwired circuitry may be used in place of or in combination with software instructions to implement processes described herein. Thus, implementations described herein are not limited to any specific combination of hardware circuitry and software.

Although FIG. 2 shows exemplary components of user device 110, in other implementations, user device 110 may contain fewer components, additional components, different components, or differently arranged components than depicted in FIG. 2. Additionally, or alternatively, in other implementations, one or more components of user device 110 may perform one or more tasks described as being performed by one or more other components of user device 110.

Exemplary IC Configurations

Figure 3:
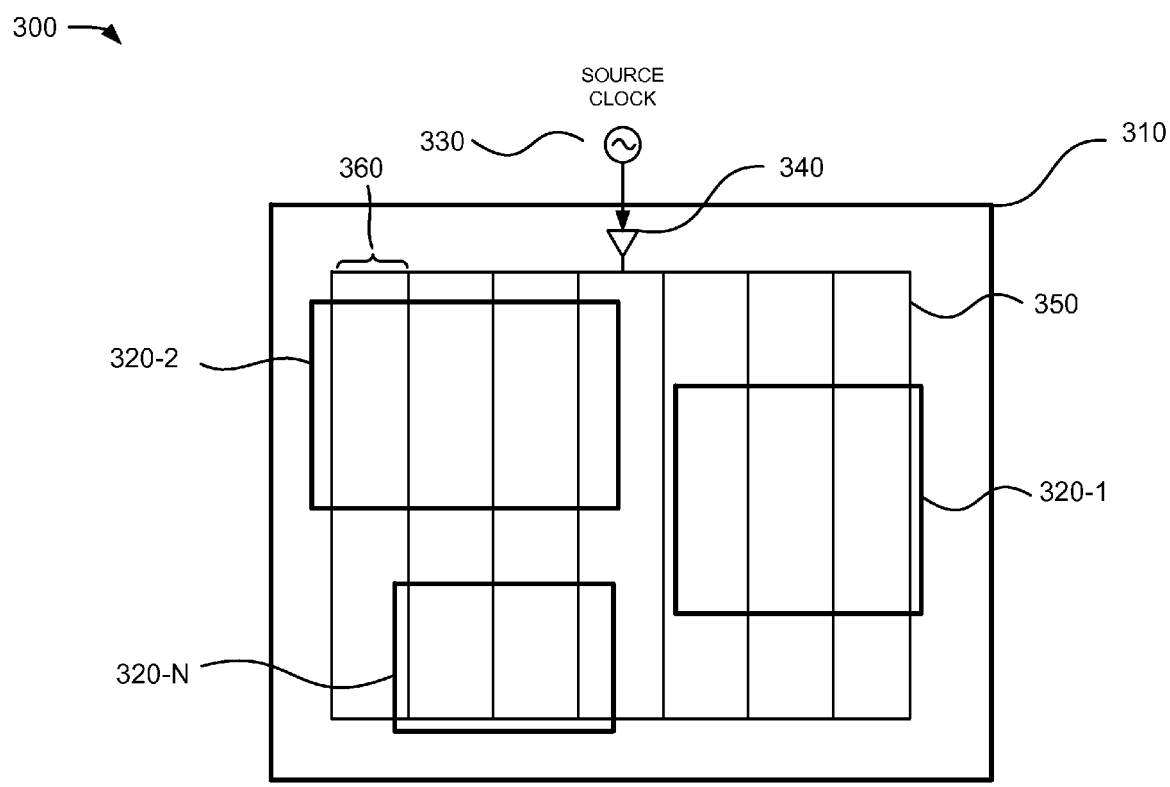
FIG. 3 is a diagram of an exemplary integrated circuit that includes a clock mesh overlay.

FIG. 3 is a diagram of an exemplary IC 300 that includes a clock mesh overlay. As illustrated in FIG. 3, IC 300 may include a substrate 310, a group of IC blocks 320-1, 320-2, . . . , 320-N (where N≧1) (hereinafter referred to collectively as "blocks 320" and individually as "block 320"), a source clock 330, a clock mesh buffer 340, and a clock mesh overlay 350 (hereinafter referred to as "clock mesh 350"). Although FIG. 3 depicts exemplary components of IC 300, in other implementations, IC 300 may include fewer components, different components, differently arranged components, or additional components than depicted in FIG. 3. Alternatively, or additionally, in other implementations, one or more components of IC 300 may perform one or more functions described as being performed by one or more other components of IC 300.

Substrate 310 may include any material on which an IC and/or a component of an IC may be installed. For example, substrate 310 may be a semiconductor material configured to enable IC components to be installed, such as a silicon chip, a germanium chip, a gallium arsenide chip and/or another semiconductor material and/or configuration. In another implementation, substrate 310 may be an insulator material, conductive material, a circuit board, a breadboard and/or another material that is configured to enable IC components to be installed. Although a number of different substrate materials and configurations are discussed above, in the description to follow, substrate 110 will be described as a silicon chip.

Block 320 may be a region on substrate 310 that may include electrical components (e.g., transistors, resisters, inductors, capacitors, wires, etc.), logical components (e.g., logic gates, flip flops, etc.) and/or other components, such as amplifiers, I/O devices, etc. Block 320 may be partitioned to perform a particular function or set of functions for IC 300. For example, block 320 may include a CPU, wires to connect to/from the CPU, logic gates to control the CPU, etc. In another example, block 320 may include a memory device or group of memory devices (e.g., RAM, ROM, registers, flip flops, etc.) and may include wires to connect to/from the memory devices and/or logic gates to control read functions, write functions and/or other functions associated with block 320. In other examples, block 320 may include other devices that perform other functions for an IC. Block 320 may be connected to other blocks 320 and/or other components on IC 300, such as clock mesh 350, power sources, etc.

Source clock 330 may include a component or set of components capable of generating a clock signal for IC 300. For example, source clock 330 may include a crystal oscillator that generates a periodic signal that may be amplified, processed and/or outputted to one or more components in IC 300. Source clock 330 may output a clock signal, such as a square wave, a sinusoidal wave and/or some other waveform, with a particular period and/or duty cycle that triggers components in IC 300 to perform a function. Source clock 330 may be located on substrate 310 or external to substrate 310. Source clock 330 may be connected to clock mesh buffer 340.

Clock mesh buffer 340 may include a component or set of components capable of buffering a received clock signal and/or driving clock mesh 350. For example, clock mesh buffer 340 may include a delay device (e.g., an inverter, a capacitor, a resistor-capacitor (RC) circuit, etc.) that may store an electronic charge received from an incoming signal and may output the stored charge, at some later point in time (e.g., when a particular current density is reached within the buffer and/or upon some other triggering event), to clock mesh 350. Clock mesh buffer 340 may be designed to drive clock mesh 350 (e.g., and components requiring clock signal inputs attached to clock mesh 350) and/or to control the clock signal period, amplitude, rise time, waveform, etc. for IC 300.

Clock mesh 350 may include a component or set of components that distribute a clock signal, received from clock mesh buffer 340, to components, within in IC 300, requiring clock signal inputs. For example, clock mesh 350 may include a wire or set of wires interconnected in a grid-like configuration and/or another configuration. The wire or set of wires may be made of a conductive material (e.g., with conductivity "σ"), may have a particular width and/or depth to achieve a particular cross sectional area (e.g., cross sectional area "$A_{CM}$"), and may have particular dimensions within substrate 310. Each wire, of clock mesh 350, may be configured with a particular conductivity σ, cross sectional area A, and/or one or more wire lengths (e.g., $L_{CM}$) that enable clock mesh 350 to have low resistance characteristics (e.g. where resistance $R=L_{CM}/(\sigma \times A_{CM})$) and/or have known delay characteristics. The resulting clock mesh 350 may be capable of distributing a clock signal, received from clock mesh buffer 340, to components, requiring clock signal inputs, in a controlled manner, with known clock skew characteristics, and/or with known clock latency characteristics.

As shown in FIG. 3, the configuration of clock mesh 350 may be a series of parallel wires connected at both ends by a header wire. In another example, clock mesh 350 could be a grid of wires that may include a series of parallel wires connected at both ends by a header wire overlaid with another series of parallel wires with a different orientation than the series of parallel wires (e.g., orthogonal to or some other angular offset) connected at both ends by another header wire. In still another example, clock mesh 350 may include non-parallel wires and/or some other configuration to distribute a clock signal to components in IC 300.

The dimensions of, the quantity of and/or the placement of wires associated with clock mesh 350 may automatically calculated. For example, the design application may automatically determine the perimeter dimensions of clock mesh 350 to ensure that each component requiring a clock signal input is either inside the perimeter of clock mesh 350 or within a particular minimum distance (e.g., a particular distance set by the user of user device 110) from the perimeter of clock mesh 350 ($D_{MIN}$) if a particular component is outside the perimeter.

Additionally, or alternatively, using the component location information (e.g., obtained from the placement layout information), the design application may compute the component density information (e.g., number of components per unit area) for substrate 310, for one or more regions within substrate 310, and/or for one or more blocks 320 associated with IC 300. The design application may automatically determine the wire interval (e.g., wire interval 360), associated with clock mesh 350, to ensure that each component, requiring clock signal inputs, is within a particular minimum distance (e.g. $D_{MIN}$ or some other distance) from a wire associated with clock mesh 350.

Figure 4A:
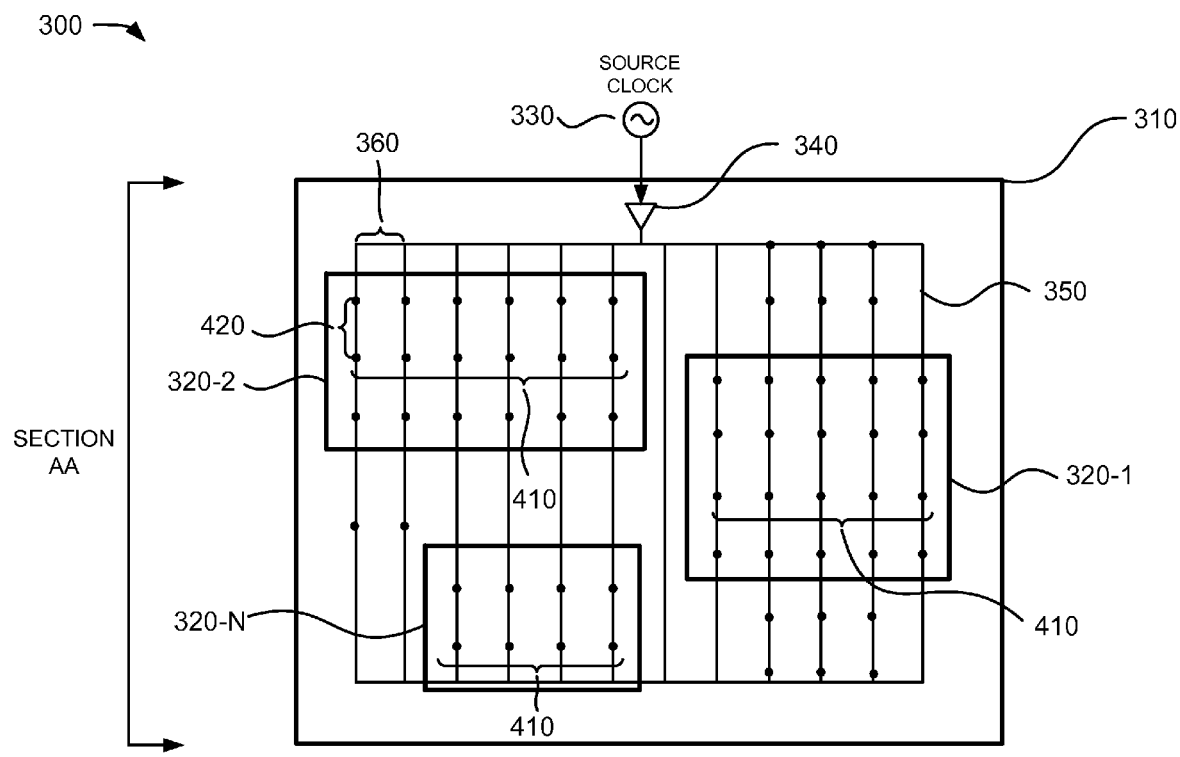
FIG. 4A is a diagram of an exemplary integrated circuit that includes a drop point array.

FIG. 4A is a diagram of an exemplary IC 300 that includes a drop point array. As illustrated in FIG. 4A, IC 300 may include the same or similar components as described above with respect to FIG. 3. Additionally, or alternatively, IC 300 may include drop points 410 (referred to collectively as "drop points 410" and individually as "drop point 410") and drop point interval 420. Drop points 410 may include a set of conductive connectors that are connected to wires, associated with clock mesh 350, at regular and/or uniform intervals (e.g., drop point interval 420). Drop points 410 may extend from a particular wire, associated with clock mesh 350, through an insulator substrate, into block 320 and/or into the proximity of one or more components in IC 300.

The design application may automatically determine the placement of each drop point 410 in IC 300 and may deploy a drop point array that corresponds to clock mesh 350. For example, the design application may determine the placement of each drop point 410 by using the component location information and the component density calculation discussed above with respect to FIG. 3. The design application may automatically determine drop point interval 420, corresponding to the separation between each drop point 410, by inserting each drop point 410 in a manner that ensures that each component is within a particular minimum distance (e.g., a distance $D_{MIN}$ as set by the user of user device 110) of the nearest drop point 410 without being coincident with a particular drop point 410. In other words, the design application may insert drop points 410 along a wire, associated with clock mesh 350, at uniform interval (e.g., drop point interval 420) unless a particular drop point 410 would impinge upon (e.g., share approximately the same X and Y coordinates as) a particular component. The design application may generate an array of drop points 410 for substrate 310, block 320 and/or a region of IC 300 that includes components, requiring clock signal inputs, as illustrated in FIG. 4A.

Figure 4B:
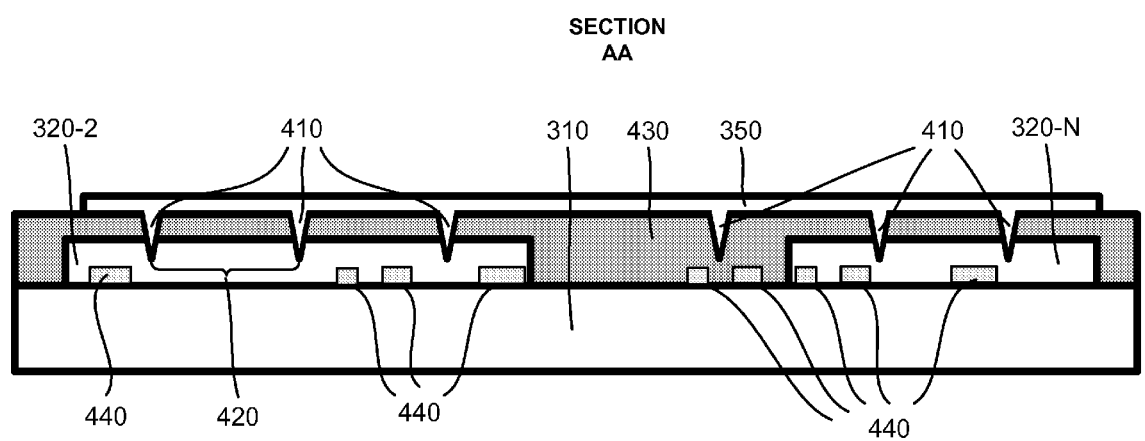
FIG. 4B is a diagram of an exemplary cross section of an integrated circuit that includes a drop point array.

FIG. 4B is a diagram of an exemplary cross section AA of IC 300, that includes a drop point array. As illustrated in FIG. 4B, section AA, of IC 300, may include the same or similar components and/or items as shown in FIG. 4A. Additionally, or alternatively, section AA, of IC 300, may include an insulator substrate 430 and electrical components 440 (hereinafter referred to collectively as "components 440" and individually as "component 440"). Insulator substrate 430 may include a material or group of materials that have the properties of an insulator and/or act as an insulator for a wire associated with clock mesh 350. For example, insulation substrate 430 may include a layer of insulation material that separates wires associated with clock mesh 350 from substrate 310, blocks 320, components 440 and/or other wires, logic gates, and/or other components associated with IC 300. Components 440 may be a component or set of components in IC 300, such as a register, a flip flop, a transistor, a clock buffer, an inverter, etc., that requires a clock signal input.

As discussed above, with respect to FIG. 4A, drop points 410 may be connected to a wire associated with clock mesh 350 and may be inserted into block 320 and/or located in the proximity of components 440 (e.g., within a distance of no more than approximately $D_{MIN}$ or some other distance determined by the user of user device 110). Drop points 410 may extend into block 320 and/or near components 440, through insulation layer 430, where each component 440 may be within the particular minimum distance of at least one drop point 410.

Although FIGS. 4A and 4B depict exemplary components of IC 300, in other implementations, IC 300 may include fewer components, different components, differently arranged components, or additional components than depicted in FIGS. 4A and 4B. Alternatively, or additionally, in other implementations, one or more components of IC 300 may perform one or more functions described as being performed by one or more other components of IC 300.

Figure 5:
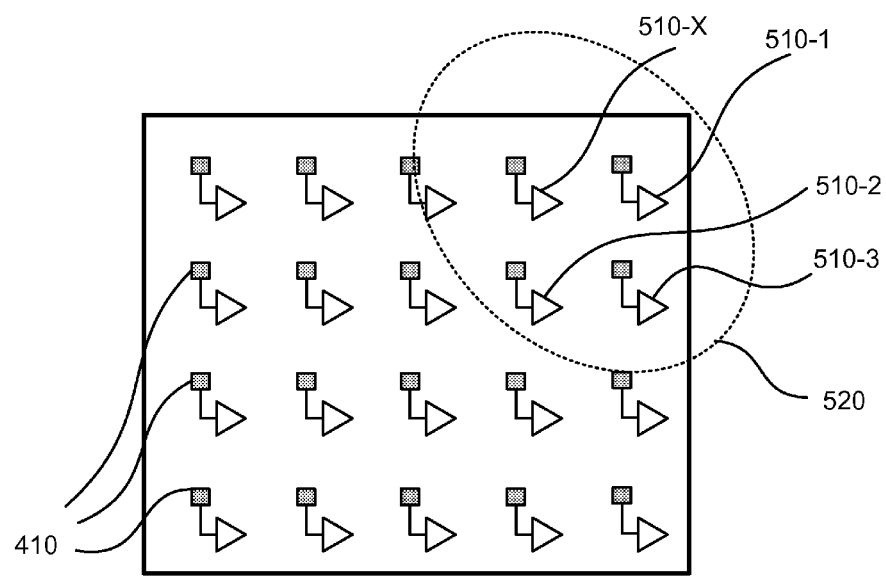
FIG. 5 is a diagram of an exemplary integrated circuit block that includes a clock buffer topology.

FIG. 5 is a diagram of an exemplary block 320-1 that includes a clock buffer topology. As illustrated in FIG. 5, block 320-1 may include local clock buffers 510-1, 510-2, . . . , 510-X (where $X \geq 1$) (hereinafter referred to collectively as "clock buffers 510" and individually as "clock buffer 510"). Clock buffer 510 may include one or more delay components that may introduce a delay into an incoming clock signal to reduce clock slew among components, requiring clock signal inputs, within block 320-1. Clock buffer 510 may include a delay inverter, a buffer, an RC circuit, and/or some other delay component. Clock buffer 510 may be connected to a drop point 410 via a wire and may receive a clock signal (e.g., from clock mesh 350 via drop point 410) at an input terminal to clock buffer 510.

The design application may compute clock cycle delay information associated with each drop point 410 of the drop point array and may further determine the desired clock buffer 510 characteristics, at each drop point 410, based on the clock cycle delay information. For example, assume that the design application determines that a particular clock buffer 510, located a maximum distance (e.g., $L_{MAX}$) from a clock source (e.g., the output of clock mesh buffer 340), may experience a maximum clock signal delay time (e.g., $T_{MAX}$) due to the time it takes for the clock signal to travel the distance of $L_{MAX}$ to the particular clock buffer 510 (e.g., according to the formula: $T_{MAX} = L_{MAX}/V$, where V is the velocity that the clock signal propagates through clock mesh 350). $T_{MAX}$, associated with clock mesh 350, may determine the clock latency of IC 300.

Assume further that the design application determines that another clock buffer 510, located at a fixed distance (e.g., $L_{CB}$) from the clock source (e.g., where $L_{CB} < L_{MAX}$), receives the clock signal with a particular clock signal delay time (e.g., according to the formula: $T_D = L_{CB}/V$, where $T_D$ is the particular clock signal delay time). Assume still further that the design application determines that yet another clock buffer 510, located at a negligible distance (e.g., $L_{MIN}$) from the clock source (e.g., where $L_{MIN} \cong 0$), receives the clock signal with a minimum clock signal delay time (e.g., according to the formula: $T_{MIN} = L_{MIN}/V = 0/V = 0$, where $T_{MIN}$ is the minimum clock signal delay time). From the clock signal delay information, the design application may determine that maximum time buffering may be desired at drop point 410 corresponding to the minimum distance, $L_{MIN}$, from the clock source. By contrast, the design application may determine that a negligible amount of time buffering may be required at drop point 410 corresponding to the maximum distance, $L_{MAX}$, from the clock source. The design application may use the clock signal delay information corresponding to each drop point 410, associated with the drop point array, to determine the degree of time buffering required at each drop point 410 in order to perform a clock buffer seeding operation. A portion of block 320-1, as indicated by ellipse 520 (hereinafter referred to as "block portion 520"), will be discussed below.

Although FIG. 5 depicts exemplary components of block 320-1, in other implementations, block 320-1 may include fewer components, different components, differently arranged components, or additional components than depicted in FIG. 5. Alternatively, or additionally, in other implementations, one or more components of block 320-1 may perform one or more functions described as being performed by one or more other components of block 320-1.

Figure 6:
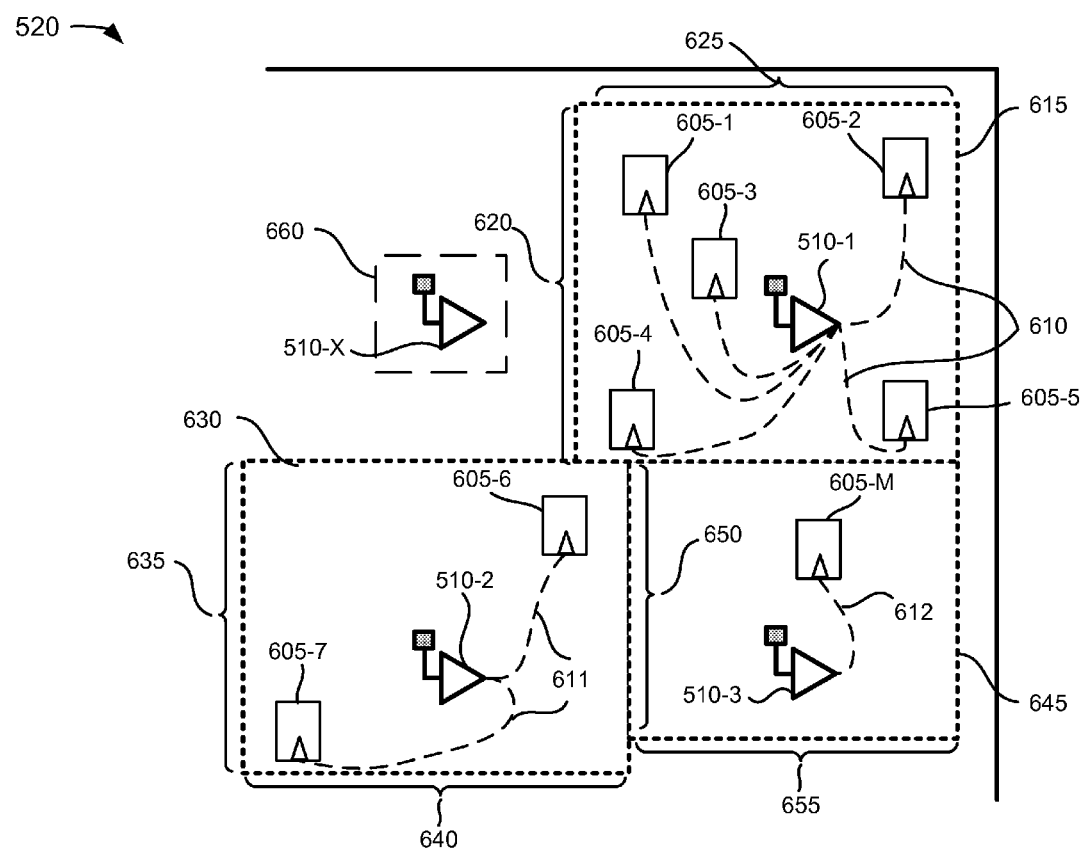
FIG. 6 is a diagram of an exemplary integrated circuit block portion that includes a logical mapping of flip flops to local clock buffers.

FIG. 6 is a diagram of an exemplary block portion 520 that includes a logical mapping of flip flops to clock buffers 510. As illustrated in FIG. 6, block portion 520 may include the same or similar components as the components described above with respect to FIG. 5. Additionally, or alternatively, block portion 520 may include a group of components (shown as flip flops 605-1, 605-2, . . . , 605-M (where $M \geq 1$) (hereinafter referred to collectively as "flip flops 605" and individually as "flip flop 605")). Although FIG. 6 depicts exemplary components of block portion 520, in other implementations, block portion 520 may include fewer components, different components, differently arranged components, or additional components than depicted in FIG. 6. For example, while FIG. 6 includes a group of flip flops 605, in another implementation, a device or group of devices, other than or in addition to the group of flip flops 605, may be included. Alternatively, or additionally, in other implementations, one or more components of block portion 520 may perform one or more functions described as being performed by one or more other components of block portion 520.

Flip flops 605 may include a device that may store one bit of information, such as an SR flip flop, a JK flip flop, a D flip flop, etc. and which may change state (e.g., from zero to one or from one to zero) only when a clock signal is received (e.g., a rising edge or falling edge of a clock pulse). Flip flops 605 may provide inputs to or be an integral part of other components in IC 300 such registers, logic gates, memory devices, etc.

The design application may perform a logical mapping operation. For example, the design application may automatically determine, for each flip flop 605, the closest clock buffer 510 and may logically map each flip flop 605 to the closest clock buffer 510 based on a distance computation. The design application may automatically compute the distance between the coordinates associated with a particular flip flop 605 (e.g., $X_1$ and $Y_1$) and the coordinates associated with a particular clock buffer 510 (e.g., $X_2$ and $Y_2$) using the Pythagorean Theorem (e.g., distance=$((X_1-X_2)^2+(Y_1-Y_2)^2)^{-1/2}$). The design application may compute a set of distances by repeating the distance computation for the particular flip flop 605 relative to each clock buffer 510 in block 320-1. The design application may logically map the particular flip flop 605 with a particular clock buffer 510 corresponding to the shortest computed distance taken from the set of computed distances. The design application may generate distance information by repeating the computation for each flip flop 605 until all flip flops 605, within block 320-1, are logically mapped to a corresponding clock buffer 510.

The design application may generate clock boxes based on the distance information. For example, the design application may generate a clock box for a particular clock buffer 510 by determining whether at least one flip flop 605 is logically mapped to the particular clock buffer 510. Furthermore, the clock box dimensions may be determined based on logically connected flip flops 605 that are the greatest distance from the particular clock buffer 510. For example, as shown in FIG. 6, clock box 615 contains flip flops 605-1 through 605-5 that may be logically mapped, as shown by dotted lines 610, with clock buffer 510-1. The design application may automatically determine the vertical dimension 620 and horizontal dimension 625 based on the coordinates of the flip flops 605-1 through 605-5 that may be logically mapped to clock buffer 510-1. In another example, clock box 630 may include flip flops 605-6 and 605-7, which are logically mapped, as shown by dotted lines 611, to clock buffer 510-2. Vertical dimension 635 and horizontal dimension 640 may be determined by the design application based on the coordinates of flip flops 605-6 and 605-7. In yet another example, clock box 645 may include a single flip flop 605-M that may be logically mapped, as shown by dotted line 612, to clock buffer 510-3. Vertical dimension 650 and horizontal dimension 655 may be automatically determined by the design application based on the coordinates of flip flop 605-M.

The design application may not generate a clock box for clock buffers 510 to which no components are logically mapped. For example, as shown in FIG. 6, there are no flip flops 605 and/or other components logically mapped to clock buffer 510-X. In this example, the design application may not generate a clock box for clock buffer 510-X.

Figure 7:
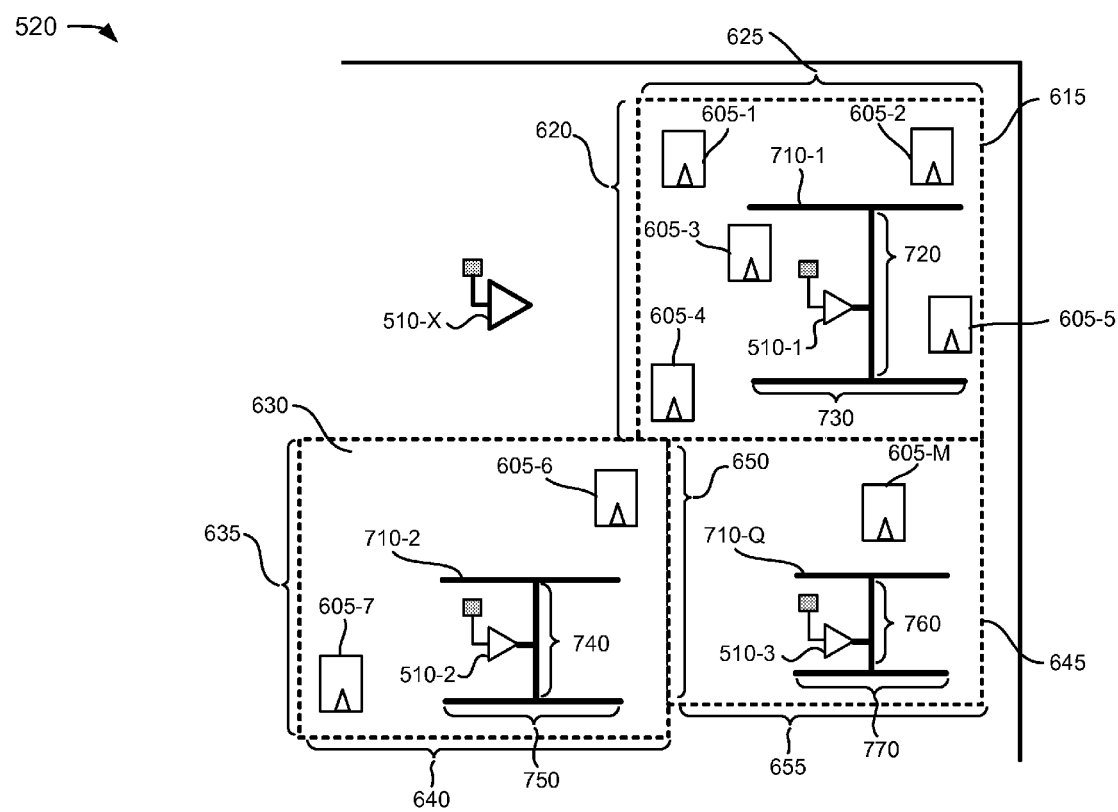
FIG. 7 is a diagram of an exemplary integrated circuit block portion that includes an H-tree topology.

FIG. 7 is a diagram of an exemplary block portion 520 that includes an H-tree topology. As illustrated in FIG. 7, block portion 520 may include the same or similar components as the components described above with respect to FIG. 6. Additionally, or alternatively, block portion 520 may include a group of H-trees 710-1, 710-2, . . . , 710-Q (where Q≧1) (hereinafter referred to collectively as "H-trees 710" and individually as "H-tree 710"). While FIG. 7 illustrates exemplary components of block portion 520, in other implementations, there may be fewer components, additional components, different components, or differently arranged components of block portion 520. As one example, in another implementation, Y-shaped trees, T-shaped trees, other-shaped trees and/or combination of trees may be included in block portion 520. Alternatively, or additionally, in other implementations, one or more components of block portion 520 may perform one or more functions described as being performed by one or more other components of block portion 520.

H-tree 710 may include a component or set of components capable of carrying a clock signal with negligible delay. For example, H-tree 710 may include a wire or set of wires interconnected in an H-shaped configuration. The wire or set of wires may be made of a conductive material (e.g., with conductivity "σ"), may have a particular width and/or depth to achieve a particular cross sectional area (e.g., cross sectional area "A"), and may have a particular wire length (e.g., wire length "$L_H$"). Each wire, of a particular H-tree 710, may be configured with a particular conductivity σ, cross sectional area A, and/or length $L_H$ to generate a particular H-tree 710 with low resistance characteristics (e.g., where resistance $R=L_H/(\sigma \times A)$) and/or with negligible delay characteristics. The resulting H-tree 710 may be capable of carrying a clock signal with a particular waveform, current density, bandwidth, and/or amplitude to a component connected to the particular H-tree (e.g., flip flop 605) with negligible delay.

The design application may automatically generate an H-tree for each clock box that was created as a result of the logical mapping operation. For example, for a clock box of a particular size, the design application may generate H-tree 710 with a size that is determined based on a particular proportion (e.g., a proportion specified by a user of user device 110) of the dimensions of the clock box. Additionally, or alternatively, the design application may connect an appropriately sized H-tree 710 to clock buffer 510 associated with each clock box. As illustrated in FIG. 7, for example, the design application may generate H-tree 710-1 with vertical dimension 720 and horizontal dimension 730 that are based on the particular proportion (e.g., the proportion specified by the user) of vertical dimension 620 and horizontal dimension 625, respectively, of clock box 615.

For another clock box, with dimensions that are smaller than the clock box discussed above, the design application may generate another H-tree with dimensions that are smaller than the particular H-tree discussed above. For example, the design application may generate H-tree 710-2 with vertical dimension 740 and horizontal dimension 750 that are based on the particular proportion of vertical dimension 635 and horizontal dimension 640, respectively, of clock box 630. For yet another clock box, with dimensions that are smaller than the other clock box, the design application may generate yet another H-tree with dimensions that are smaller than the other H-tree. For example, the design application may generate H-tree 710-Q with vertical dimension 760 and horizontal dimension 770 that are based on the particular proportion of vertical dimension 650 and horizontal dimension 655, respectively, of clock box 645.

Figure 8:
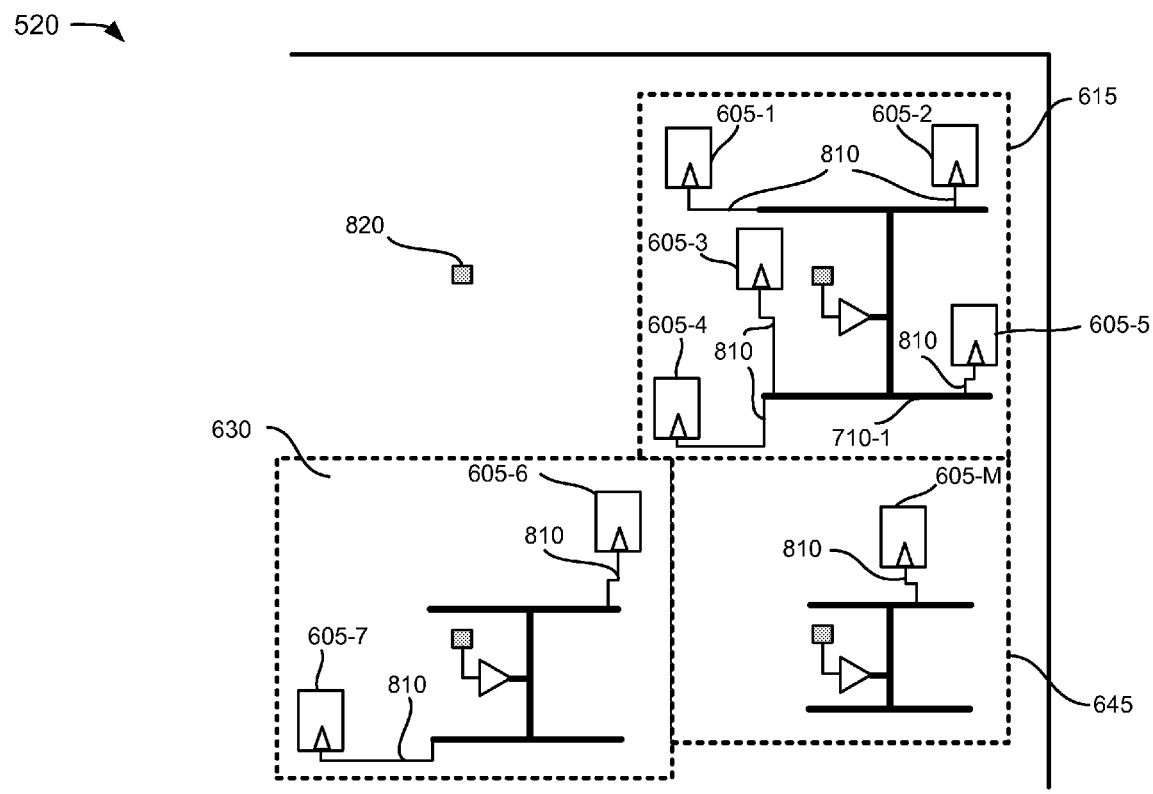
FIG. 8 is a diagram of an exemplary integrated circuit block portion that includes flip flops routed to an H-tree topology.

FIG. 8 is a diagram of an exemplary block portion 520 that includes flip flops 605 that are routed to an H-tree topology. As illustrated in FIG. 8, block portion 520 may include the same or similar components as the components described above with respect to FIG. 7. Additionally, or alternatively, block portion 520 may include routing wires 810. Routing wire 810 may be made of a conductive material that may enable a clock signal to be carried from H-tree 710 to flip flop 605.

The design application and/or another design tool (e.g., a PNR tool) may perform an automatic routing operation. For example, as shown in FIG. 8, the design application and/or PNR tool may automatically generate routing wires 810 to connect flip flops 605, corresponding to a particular clock box, to H-tree 710 associated with the particular clock box. Routing wires 810 may connect H-trees 710 and flip flops 605 in short and/or direct routes, where each routing wire 810 may have a nominal routing length (e.g., routing length "$L_R$").

To minimize delay and/or clock skew, routing length $L_R$ may be similar to H-tree 710 wire length $L_H$ (e.g., $L_R \cong L_H$) as discussed above with respect to FIG. 7 and/or may be much smaller than clock mesh length $L_{CM}$ (e.g., $L_R \ll L_{CM}$), as discussed above with respect to FIGS. 3 and 4A, corresponding to the location of a particular clock buffer 510 on clock mesh 350. As illustrated in FIG. 8, for example, the design application or PNR tool may automatically route routing wires 810 from flip flops 605-1 through 605-5 to H-tree 710-1 associated with clock box 615. The design application and/or PNR tool may repeat the automatic routing operation for other clock boxes within block 320-1, within other blocks 320, and/or within IC 300 until all flip flops 605 are connected to corresponding H-trees 710 and/or clock buffers 510 to which they are logically mapped.

The design application may determine that certain clock buffers 510 are not connected to any H-trees 710 and/or are not associated with a clock box and may remove clock buffer 510 from drop point 410 as shown as indication 820 in FIG. 8.

Exemplary Processes

Figure 9A:
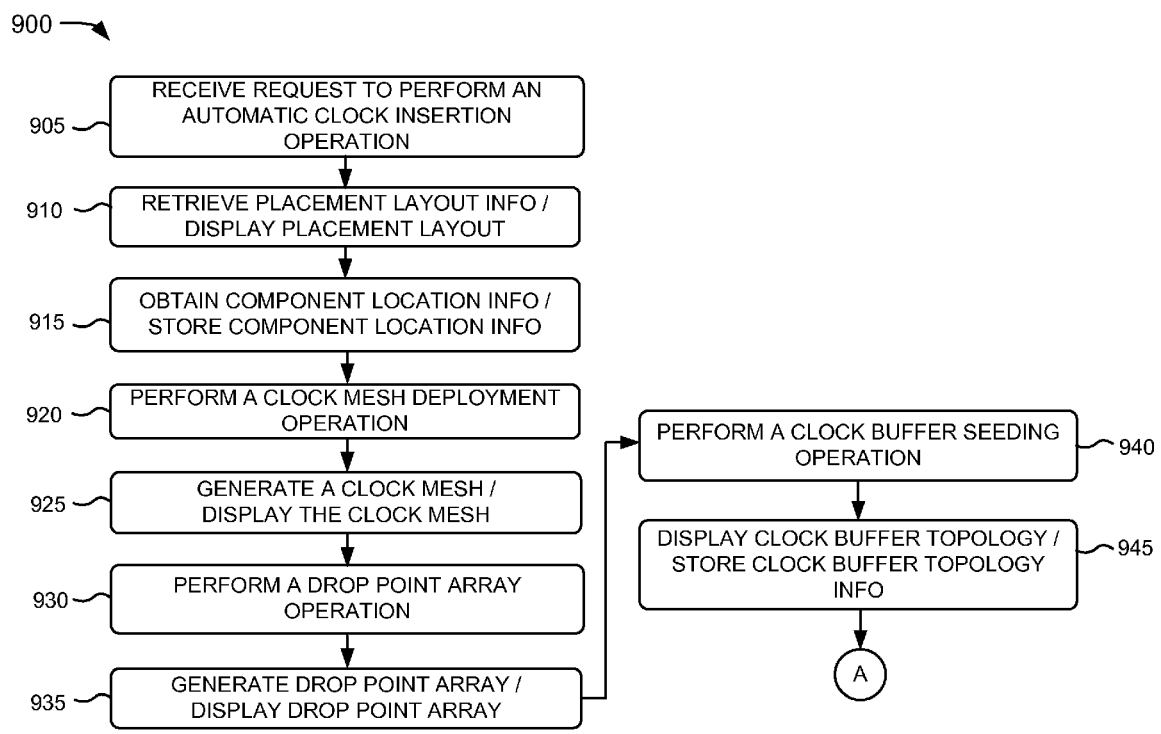
FIGS. 9A and 9B are flowcharts of an exemplary process of an automated clock insertion operation that is capable of being performed by the user device of FIG. 1.
Figure 9B:
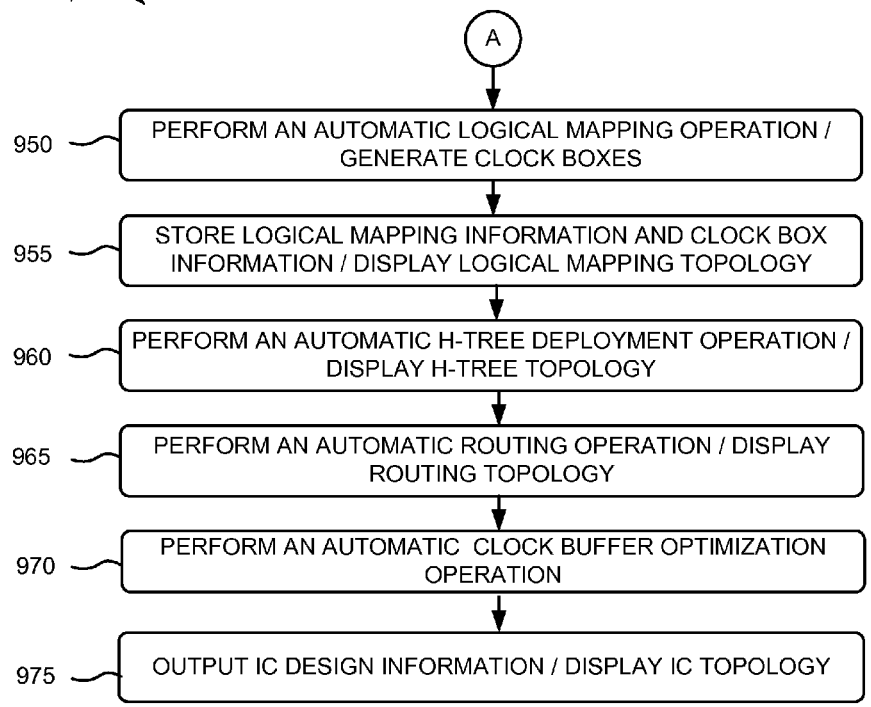

FIGS. 9A and 9B are flowcharts of an exemplary process 900 for performing an automated clock insertion operation that is capable of being performed by user device 110. In one implementation, process 900 may be performed by user device 110. In another implementation, some or all of process

900 may be performed by a device or collection of devices separate from or in combination with user device 110.

Process 900, of FIGS. 9A and 9B, may include receiving a request to perform an automated clock insertion operation (block 905). Assume that a particular IC is undergoing design activities, as part of an electronic design automation process (e.g., as discussed above with respect to FIG. 1), that has resulted in a specification that was generated from operations associated the ESL phase and/or has resulted in a logical description of the specification that was generated from operations associated with an RTL phase. Assume further that, as part of the PDL phase, the floorplanning stage has resulted in floorplanning information corresponding to dividing the chip, on which the IC is to be fabricated, into regions and/or a set of blocks in which components may be placed; that the logic synthesis stage has resulted in a gate-level netlist of components that may execute the operations required by the RTL; and/or that the placement stage has resulted in the generation of placement layout information, corresponding to the specific location that logic gates and/or other components, identified in the netlist, may be fabricated onto the chip. For example, user device 110 may receive a request from a user to perform an automated clock insertion operation, as part of the clock insertion stage of the PDL phase, for the particular IC undergoing design activities.

Placement layout information may be retrieved and placement layout information may be displayed (block 910). For example, user device 110 may receive the request to perform an automated clock insertion operation associated with the particular IC and may retrieve a design application. The design application may retrieve the placement layout information and the floorplanning information associated with the particular IC from the memory of user device 110. The design application may present the boundaries of the chip substrate (e.g., substrate 310), IC blocks (e.g., blocks 320), electrical components (e.g., flip flops 605 and/or other components), logic gates, etc. for display on the display associated with user device 110, based on the placement layout information and/or the floorplanning information.

Component location information may be obtained and component location information may be stored (block 915). For example, the design application may obtain, from the placement layout information, component location information associated with components (e.g., registers, flip flops, transistors, etc.) requiring clock signal inputs. The component location information may include the coordinates (e.g., X and Y coordinates on substrate 310) at which each component, requiring clock signal inputs, may be placed. Additionally, or alternatively, the component location information may include information corresponding to the particular pin and/or terminal that the clock signal may be provided and/or the specific coordinates on the IC at which the pin may be located, for each component requiring clock signal inputs.

A clock mesh deployment operation may be performed (block 920). For example, using location coordinates corresponding to each component, requiring clock signal input, the design application may automatically determine the dimensions of a clock mesh (e.g., clock mesh 350) associated with the particular IC (e.g., IC 300). The design application may set the perimeter dimensions of clock mesh 350 to ensure that each component, requiring clock signal input (e.g., flip flops 605), is inside the perimeter of clock mesh 350. If a particular component is outside the perimeter of clock mesh 350, then the design application may revise clock mesh 350 perimeter dimensions so that the particular component is within a particular minimum distance (e.g., a particular distance $D_{MIN}$ as set by the user of user device 110) from the perimeter of clock mesh 350. The design application may determine whether a particular component is within $D_{MIN}$ by using the Pythagorean Theorem (e.g., distance=$((X_1-X_2)^2+(Y_1-Y_2)^2)^{-1/2}$) to compute the distance between the component (e.g., with $X_1$ and $Y_1$ coordinates) and a location on clock mesh 350 perimeter (e.g., with $X_2$ and $Y_2$ coordinates) closest to the component and comparing the computed distance with $D_{MIN}$.

The design application may determine the intervals between wires associated with the clock mesh. For example, in a manner similar to that described above with respect to FIG. 3, the design application may compute the density in which components are to be installed on the chip substrate (e.g., substrate 310), within a particular block (e.g., block 320) and/or within a particular region on chip substrate 310. From the component density information, the design application may determine the wire intervals between wires associated with clock mesh 350. The design application may adjust the wire interval by adding wires to or removing wires from clock mesh 350 in order to ensure that each component is within a particular distance (e.g., a distance, such as $D_{MIN}$, as set by the user of user device 110) of a clock mesh wire. The design application may minimize and/or avoid placing wires associated with clock mesh 350 directly over components to decrease antenna effects between a wire and a component, to avoid drop point interference with a component, and/or to optimize thermal gradient or heat dissipation characteristics associated with IC 300.

A clock mesh may be generated and the clock mesh may be displayed (block 925). For example, the design application may generate clock mesh 350, with particular perimeter dimensions and particular wire intervals, based on the component density information and $D_{MIN}$ as set by the user (e.g., the user of user device 110). The design application may present information associated with clock mesh 350 (e.g., perimeter dimensions and wire intervals, etc.) for display on the display of user device 110.

A drop point array operation may be performed (block 930). For example, in a manner similar to that described above with respect to FIG. 4A, the design application may automatically determine the drop point interval (e.g., drop point 410 of FIG. 4) along a particular wire, associated with clock mesh 350, based on the component location information. The design application may determine the drop point interval in order to ensure that each component is within a particular minimum distance (e.g., such as distance $D_{MIN}$ and/or some other distance as set by the user of user device 110) of at least one drop point 410. The design application may insert drop points 410 along one or more wires, associated with clock mesh 350, at the particular drop point interval. If, however, the design application determines that a particular drop point 410 could impinge upon (e.g., share approximately the same X and Y coordinates as) a particular component, then the design application may not insert a drop point 410 at the particular coordinate where the component is placed.

A drop point array may be generated and the drop point array may be displayed (block 935). The design application may automatically generate an array of drop points 410 for a particular block (e.g., block 320 of FIG. 3), for a particular region of the IC (e.g., IC 300), and/or for the chip substrate (e.g., substrate 310) on which the IC is to be fabricated. The design application may store the X and Y coordinates, of each drop point 410 associated with the drop point array, in the memory associated with user device 110. The design application may present information associated with the drop point array for display on the display of user device 110.

A clock buffer seeding operation may be performed (block 940). For example, in a manner similar to that described above with respect to FIG. 5, the design application may compute clock cycle delay information (e.g., $T_D$) for each drop point (e.g., drop point 410), associated with the drop point array. The clock cycle delay at a particular drop point 410 may be proportional to the distance (e.g., $L_{CB}$) from the particular drop point 410 and the point at which the clock signal is received by clock mesh 350 (e.g., at the output of clock mesh buffer 340 of FIG. 3). From the clock cycle delay information, the design application may determine the amount of time buffering (e.g., $T_B$) required at each drop point 410 associated with the drop point array. For example, the design application may determine the amount of time buffering (e.g., $T_B$) required at each drop point 410 based on the formula: $T_B = T_{MAX} * ((L_{MAX} - L)/L_{MAX})$, where L may correspond to the distance between a particular drop point 410 and the clock source (e.g., the output of clock mesh buffer 340).

The design application may use the X and Y coordinates for a particular drop point 410 and may automatically insert a local clock buffer (e.g., clock buffer 510) configured to provide a particular time delay (e.g., $T_B$) to a clock signal, received from clock mesh 350 via a particular drop point 410. The design application may repeat the clock buffer seeding operation for each drop point 410 and may connect each drop point 410 with the corresponding co-located clock buffer 510. In another example, the design application may insert more than one clock buffer 510, for each drop point 410, and may connect each clock buffer 510 to each drop point 410.

The clock buffer topology may be displayed and the clock buffer topology information may be stored (block 945). The design application may present the clock buffer topology information (e.g., the clock buffer location information, such as X and Y coordinates, for each inserted clock buffer 510 and/or for each clock buffer 510 connected to a drop point 410) for display on the display associated with user device 110. The design application may store the clock buffer topology information (e.g., clock buffer location information and/or time buffering characteristics) in the memory associated with user device 110.

An automatic logical mapping operation may be performed and clock boxes may be generated (block 950 of FIG. 9B). Assume, for simplicity, that components being mapped to clock buffers are flip flops 605. It should be understood that components, requiring clock signal inputs, other than flip flops 605 (e.g., registers, transistors, etc.) may be mapped to clock buffer 510. A distance calculation may be performed and flip flops 605 may be logically mapped to local clock buffers. For example, the design application may, in a manner similar to that described above with respect to FIG. 6, automatically determine, for each flip flop 605, the closest clock buffer 510 and may logically map each flip flop 605 to the closest clock buffer 510 based on a distance computation (e.g., based on the Pythagorean Theorem). The design application may automatically compute a set of distances between coordinates associated with a particular component (e.g., flip flop 605) and coordinates associated with each clock buffer 510, connected to drop point 410, within the drop point array. The design application may logically map the particular flip flop 605 to a particular clock buffer 510 that corresponds to the shortest computed distance, from the set of computed distances, associated with the particular flip flop 605. The design application may generate distance information by repeating the computation for each flip flop 605 until all flop flops 605 are logically mapped to a corresponding clock buffer 510.

The design application may generate clock boxes based on the distance information. For example, in a manner similar to that described above with respect to FIG. 6, the design application may generate a clock box for a particular clock buffer 510 by determining whether at least one flip flop 605 is logically mapped to the particular clock buffer 510. Furthermore, the design application may determine the clock box dimensions corresponding to each clock buffer 510 based on coordinates associated with flip flops 605 that are the greatest distance from the particular clock buffer 510 to which flip flops 605 are logically mapped. For example, a particular clock box may contain a number of flip flops 605 that may be logically mapped to a particular clock buffer 510. The design application may automatically determine the vertical dimension and/or horizontal dimension of the particular clock box based on the coordinates of the most distant logically mapped flip flops 605 corresponding to the particular clock buffer 510. The design application may not generate a clock box for clock buffers 510 to which no components are logically mapped.

Logical mapping information and clock box information may be stored and a logical mapping topology may be displayed (block 955). For example, the design application may store the logical mapping information (e.g., flip flops 605 corresponding to clock buffers 510) and clock box information (e.g., dimensions of each clock box and/or clock buffers 510 corresponding to each clock box) in a memory associated with user device 110. Additionally, or alternatively, the design application may present logical mapping topology information for display on the display of user device 110.

An automatic H-tree deployment operation may be performed and H-tree topology information may be displayed (block 960). For example, the design application may, in a manner similar to that described above with respect to FIG. 7, automatically generate H-tree 710 for each clock box. For a clock box of a particular size, the design application may generate H-tree 710 with a size that is determined based on a particular proportion (e.g., a proportion specified by a user of user device 110) of the clock box of the particular size. Additionally, or alternatively, the design application may connect an appropriately sized H-tree 710 to clock buffer 510 associated with each clock box. For example, the design application may generate H-tree 710 and may connect the particular H-tree 710 to a particular clock buffer 510. The design application may generate H-tree 710, with a particular vertical dimension and/or a particular horizontal dimension, that are based on the particular proportion of a vertical dimension and/or a horizontal dimension, respectively, of a particular clock box 615 associated with the particular clock buffer 510. The design application may generate H-trees 710 for each clock buffer 510 for which a clock box has been generated.

The design application may present the H-tree topology information (e.g., information associated with the dimensions of H-trees 710, the coordinates of H-trees 710, and/or clock buffers 510 to which H-trees 710 are connected) for display on the display of user device 110.

An automatic routing operation may be performed and a routing topology may be displayed (block 965). For example, in a manner similar to that described above with respect to FIG. 8, the design application and/or another design tool (e.g., a PNR tool or some other design tool) may automatically generate routing wires 810 to connect flip flops 605 and/or other components requiring clock signal inputs, corresponding to a particular clock box, to H-tree 710 associated with the particular clock box. More particularly, the design application and/or the other design tool may route each route wire 810 from a terminal that accepts a clock signal input, associated with each flip flop 605, to a location on H-tree 710, associated with the particular clock box, that is the shortest distance to the particular flip flop 605. The design application and/or the other design tool may repeat the automatic routing operation for other clock boxes within block 320, within other blocks 320, and/or within IC 300 until all flip flops 605 are connected to corresponding H-trees 710 and/or clock buffers 510 to which flip flops 605 are logically mapped.

The design application may present the H-tree topology information and information associated with routing wires 810 (e.g., connection points and wire location for each routing wire 810) for display on the display of user device 110.

An automatic clock buffer optimization operation may be performed (block 970). For example, the design application may optimize clock buffer 510 characteristics, based on the fanout characteristics, associated with each clock buffer 510. For example, the design application may determine, via computation and/or measurement, the input electrical characteristics (e.g., resistance, capacitance, etc.) of each H-tree 710 that may be connected, via wires 810, to flip flops 605. The design application may determine that the input electrical characteristics for a particular H-tree 710, associated with a particular clock box, with a corresponding fanout that includes a particular number of flip flops 605, are different than the input electrical characteristics for another H-tree 710, associated with another clock box, with a corresponding fanout that includes a greater number or a small number of flip flops 605. The design application may automatically modify (e.g., increase) the size and/or capacity of clock buffers 510 associated with H-trees 710 with larger fanouts (e.g., that include a greater number of flip flops 605) and/or may modify (e.g., decrease) the size of clock buffers 510 associated with H-trees 710 with smaller fanouts (e.g., that include a smaller number of flip flops 605).

IC design information may be outputted and IC topology may be displayed (block 975). For example, the design application may store the IC design information in a memory (e.g., a memory associated with user device 110). Circuit design information may include component location information, information associated with the clock mesh 350 (e.g., perimeter dimensions, wire locations and intervals of separation, etc.), drop point array information (e.g., the coordinates of each drop point 410), information associated with clock buffers 510 (e.g., clock buffers 510 coordinates, buffering capacity and/or corresponding drop point 410), information associated with H-trees 710 (e.g., H-tree 710 coordinates, dimensions and/or corresponding clock buffer 510), and/or information associated with routing information (e.g., wires 810 coordinates, connection points that may include corresponding H-trees 710 and/or corresponding flip flops 605). The design application may present the circuit design information for display on the display of user device 110. In another example, the design application may send the IC design information to another design tool associated with the electronic automation design process and/or to an IC fabrication environment.

Conclusion

An implementation described herein may include systems and/or methods that provide for automated IC clock insertion using a technique that can automate a clock insertion operation, within an IC design process, to reduce or eliminate clock skew and/or clock latency within an IC. Additionally, or alternatively, the automated IC clock insertion may reduce the time to design, to troubleshoot, and/or to perform design revisions, associated with the clock distribution network within an IC, which may reduce the cost associated with IC design, development, and/or fabrication.

In an exemplary implementation, a user device may receive a request to perform an automated clock insertion operation and the user device may retrieve a design application. The design application may retrieve placement layout information and, from the placement layout information, the design application may obtain component location information. The design application may compute component density information associated with an IC undergoing design and may generate a clock mesh in which the perimeter dimensions of the clock mesh are based on locations of components requiring clock signal inputs. For components not included within the clock mesh perimeter, the design application may further configure the clock mesh perimeter to be within a particular minimum distance of those components, as specified by the user.

From the component density information, the design application may determine the wire interval associated with the clock mesh and may deploy the clock mesh in accordance with the perimeter dimensions and/or wire interval. The design application may, using the component density information, determine the drop point interval associated with a wire corresponding to the clock mesh and may deploy a drop point array in accordance with the clock mesh information and the drop point interval.

The design application may perform a clock buffer seeding operation and may deploy a clock buffer for each drop point in the drop point array. The design application may configure each clock buffer so that a particular amount of delay may be inserted into a received clock signal based on the location of the particular drop point in relation to a particular clock source. The design application may determine the closest clock buffer for each component and may logically map each component to the closest clock buffer. The design application may generate a clock box for each clock buffer, where the perimeter of each clock box may be based on the locations of the components that are logically mapped to the particular clock buffer and to which the clock box corresponds. The design application may generate an H-tree for each clock box where the dimensions of each H-tree are based on the dimensions of the clock box with which the H-tree is associated.

The design application and/or another design tool (e.g., a PNR tool) may perform an automatic routing operation where each component, within a particular clock box, may be connected, via a wire, to an H-tree that corresponds to the particular clock box. The design application may determine, via computation or measurement, the input electrical characteristics for each H-tree and the fanout associated with each H-tree and may modify the buffer characteristics of a clock buffer to minimize clock slew and/or clock latency associated with the clock buffer. The design application may send the IC design information to the user device for display and/or may send the IC design information to an IC fabrication environment.

The foregoing description provides illustration and description, but is not intended to be exhaustive or to limit the invention to the precise form disclosed. Modifications and variations are possible in light of the above teachings or may be acquired from practice of the invention.

While a series of blocks has been described with regard to FIGS. 9A and 9B, the order of the blocks may be modified in other embodiments. Further, non-dependent blocks may be performed in parallel.

It will be apparent that embodiments, as described herein, may be implemented in many different forms of software, firmware, and hardware in the embodiments illustrated in the figures. The actual software code or specialized control hardware used to implement embodiments described herein is not limiting of the invention. Thus, the operation and behavior of the embodiments were described without reference to the specific software code—it being understood that software and control hardware may be designed to implement the embodiments based on the description herein.

Further, certain portions, described above, may be implemented as a component that performs one or more functions. A component, as used herein, may include hardware, such as a processor, an ASIC, or a FPGA, or a combination of hardware and software (e.g., a processor executing software).

It should be emphasized that the term "comprises/comprising" when used in this specification is taken to specify the presence of stated features, integers, steps or components but does not preclude the presence or addition of one or more other features, integers, steps, components or groups thereof.

Even though particular combinations of features are recited in the claims and/or disclosed in the specification, these combinations are not intended to limit the disclosure of the invention. In fact, many of these features may be combined in ways not specifically recited in the claims and/or disclosed in the specification.

No element, act, or instruction used in the present application should be construed as critical or essential unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. A method comprising:
    receiving, by a user device, a request to perform an automatic clock insertion operation for an integrated circuit;
    retrieving, by the user device and based on the request, location information associated with a plurality of components, of the integrated circuit, that use a clock signal input;
    deploying, by the user device, a clock mesh based on the location information associated with the plurality of components;
    determining, by the user device, one or more drop point intervals associated with the clock mesh;
    inserting, by the user device, one or more drop points at the one or more drop point intervals associated with the clock mesh;
    deploying, by the user device, a particular clock buffer, of a plurality of clock buffers, for each of the one or more drop points;
    mapping, by the user device, each of one or more components, of the plurality of components, to the particular clock buffer, of the plurality of clock buffers;
    generating, by the user device, a clock box for the particular clock buffer, dimensions of the clock box being based on the location information associated with the one or more components;
    deploying, by the user device, an H-tree associated with the clock box, dimensions of the H-tree being proportional to the clock box dimensions;
    connecting, by the user device, the H-tree to the one or more components;
    performing an optimization operation, for the particular clock buffer, to reconfigure the particular clock buffer, the performing including:
        measuring input electrical parameters of the H-tree,
        determining, based on the measured input electrical parameters of the H-tree, buffering characteristics to drive the H-tree and the one or more components to which the H-tree is connected, and
        reconfiguring, based on the determined buffering characteristics, the particular clock buffer; and
    storing, by the user device, information associated with the clock mesh, information associated with the plurality of clock buffers, information associated with the H-tree, information associated with the reconfigured particular clock buffer, and the location information associated with the plurality of components.

2. The method of claim 1, where deploying the clock mesh includes:
    determining perimeter dimensions for the clock mesh based on the location information associated with the plurality of components;
    computing component density information associated with the plurality of components using the location information associated with the plurality of components;
    determining a wire interval for the clock mesh based on the component density computation; and
    generating the clock mesh based on the determination of the perimeter dimensions for the clock mesh and the determination of the wire interval for the clock mesh.

3. The method of claim 1, where inserting the one or more drop points, associated with the clock mesh, includes:
    determining a drop point interval, of the one or more drop point intervals, for the one or more drop points based on the location information associated with the plurality of components;
    identifying a location of each drop point of the one or more drop points, associated with each wire of the clock mesh, based on the determination of the drop point interval;
    comparing the location of each drop point, of the one or more drop points, to the location of each component of the plurality of components to determine whether a drop point of the one or more drop points impinges on a component of the plurality of components; and
    eliminating the drop point that impinges on the component of the plurality of components.

4. The method of claim 1, where deploying the clock buffer for each of the one or more drop points includes:
    computing a clock signal delay time associated with a time for a clock signal to travel from a clock source to a particular drop point of the one or more drop points;
    determining, from the clock signal delay time, an amount of buffering time for the particular clock buffer associated with the particular drop point; and
    configuring the particular clock buffer based on the determination of the amount of buffering time for the particular clock buffer.

5. The method of claim 1, where mapping each of the one or more components to the particular clock buffer includes:
    calculating a distance between each component of the plurality of components and the plurality of clock buffers using the location information associated with the plurality of components and coordinates for each clock buffer of the plurality of clock buffers;
    determining, for each component, of the plurality of components, a closest clock buffer, of the plurality of clock buffers, based on the distance calculation; and
    performing a logical mapping operation between the one or more components, of the plurality of components, and the closest clock buffer, of the plurality of clock buffers.

6. The method of claim 1, where generating the clock box for the particular clock buffer includes:

determining coordinates of the one or more components based on the location information associated with the one or more components; and generating the clock box to include the one or more components, based on the coordinates of the one or more components.

7. The method of claim 1, where deploying the H-tree associated with the clock box includes:

generating the H-tree corresponding to the clock box, the H-tree dimensions being based on a particular proportion of the clock box dimensions, the particular proportion being specified by a user of the user device; and connecting the H-tree to the particular clock buffer associated with the clock box.

8. The method of claim 1, where the optimization operation is performed using information associated with input electrical parameters of the H-tree.

9. The method of claim 8, where the input electrical parameters include at least one of input resistance or input capacitance associated with the H-tree interconnected with the one or more components.

10. A user device comprising:

a memory to store location information associated with a plurality of components of an integrated circuit; and a processor to:

receive a request to perform an automatic clock insertion operation for the integrated circuit, retrieve, based on the request, the location information associated with the plurality of components, of the integrated circuit, that use a clock signal input, install a clock mesh based on the location information associated with the plurality of components, where the clock mesh includes one or more drop points, insert a particular clock buffer for a particular drop point of the one or more drop points, associate one or more components, of the plurality of components, with the particular clock buffer based on the location information associated with the one or more components, generate a clock box for the particular clock buffer, dimensions of the clock box being based on the location information corresponding to one or more components, insert an H-tree associated with the clock box, dimensions of the H-tree being proportional to the clock box dimensions, route wires between the H-tree and the one or more components to connect the H-tree to the one or more components, perform an optimization operation, for the particular clock buffer to reconfigure the particular clock buffer, when performing the optimization operation the processor being further to:

measure input electrical parameters of the H-tree, determine, based on the measured input electrical parameters of the H-tree, buffering characteristics to drive the H-tree and the one or more components to which the H-tree is connected, and reconfigure, based on the determined buffering characteristics, the particular clock buffer; and store information associated with the clock mesh, information associated with the particular clock buffer, information associated with the H-tree, information associated with the reconfigured particular clock buffer, and the location information associated with the plurality of components.

11. The user device of claim 10, where, when installing the clock mesh based on the location information associated with the plurality of components, the processor is to:

determine perimeter dimensions for the clock mesh based on the location information associated with the plurality of components, compute component density information associated with the plurality of components using the location information associated with the plurality of components, determine a wire interval for the clock mesh based on the component density computation, generate the clock mesh based on the determination of the perimeter dimensions for the clock mesh and the determination of the wire interval for the clock mesh, and insert the one or more drop points at a particular interval, the particular interval being based on the location information associated with the plurality of components.

12. The user device of claim 11, where, when inserting the one or more drop points, in the clock mesh, at a particular interval, the processor is to:

identify a location for each drop point of the one or more drop points, associated with each wire of the clock mesh, based on the particular interval, compare the location of each drop point, of the one or more drop points, to the location of each component, of the plurality of components, to determine whether a drop point, of the one or more drop points, impinges on a component of the plurality of components, and remove the drop point that impinges on the component of the plurality of components.

13. The user device of claim 10, where, when inserting the particular clock buffer for the particular drop point of the one or more drop points, the processor is to:

calculate a delay time associated with a time for a clock signal to travel from a clock source to the particular drop point, determine, from the delay time, an amount of buffering time for the particular clock buffer associated with the particular drop point, and configure the particular clock buffer based on the determination of the amount of buffering time for the particular clock buffer.

14. The user device of claim 10, where the particular clock buffer is one of a plurality of clock buffers, and where, when generating the clock box for the particular clock buffer, the processor is to:

calculate a distance between each component of the plurality of components and the plurality of clock buffers using the location information associated with the plurality of components and coordinates for each clock buffer of the plurality of clock buffers, determine, for each component, of the plurality of components, a closest clock buffer, of the plurality of clock buffers, based on the distance calculation, perform a logical mapping operation between the one or more components, of the plurality of components, and the closest clock buffer, of the plurality of clock buffers, and determine the dimensions of each of the clock boxes based on coordinates of components, of the plurality of components, logically mapped to the clock box.

15. The user device of claim 10, where, when inserting the H-tree associated with the clock box, the processor is to:

generate the H-tree corresponding to the clock box, the H-tree dimensions being based on a particular proportion of the clock box dimensions, the particular proportion being specified by a user of the user device, and connect the H-tree to the particular clock buffer associated with the clock box.

16. The user device of claim 10, where, when routing wires between the H-tree and the one or more components, the processor is to:
   determine a particular connection point, of a plurality of connection points, on the H-tree for each of the one or more components, the particular connection point being a closest distance between the H-tree and a particular component of the one or more components, and
   generate a routing wire, the routing wire having a particular length that is determined based on the closest distance between the particular connection point and the particular component of the one or more components.

17. The user device of claim 10, where the processor is further to:
   perform an optimization operation, for the particular clock buffer, using information associated with input impedance information of the H-tree to resize the particular clock buffer.

18. The user device of claim 17, where, when performing the optimization operation, for the particular clock buffer, the processor is to:
   compute or measure the input impedance information for the H-tree, the input impedance information including at least one of input resistance or input reactance corresponding to the H-tree,
   determine, from the computation or the measurement, buffering characteristics to drive the H-tree, and
   resize the particular clock buffer based on the determination of the buffering characteristics.

19. A system comprising;
   one or more user devices to store location information associated with a plurality of components of an integrated circuit, the one or more user devices comprising:
      logic to receive a request to perform an automated clock insertion operation for the integrated circuit,
      logic to retrieve location information associated with the plurality of components, of the integrated circuit, that use a clock signal input,
      logic to deploy a clock mesh based on the location information associated with the plurality of components, where the clock mesh includes one or more drop points,
      logic to perform a clock buffer seeding operation, in which a particular clock buffer, of a plurality of clock buffers, is inserted for each of the one or more drop points,
      logic to map one or more components, of the plurality of components, to the particular clock buffer based on a determination that the particular clock buffer is a closest clock buffer, with respect to distance, of the plurality of clock buffers,
      logic to generate a clock box for the particular clock buffer based on location information associated with the one or more components,
      logic to deploy an H-tree for the particular clock buffer, where dimensions of the H-tree may be determined based on a proportion of a dimension of the clock box, the proportion being specified by a user of the one or more user devices,
      logic to connect the one or more components to the H-tree,
      logic to perform an optimization operation, for the particular clock buffer to reconfigure the particular clock buffer, the logic to perform the optimization operation including:
         logic to measure input electrical parameters of the H-tree,
         logic to determine, based on the measured input electrical parameters of the H-tree, buffering characteristics to drive the H-tree and the one or more components to which the H-tree is connected, and
         logic to reconfigure, based on the determined buffering characteristics, the particular clock buffer; and
      logic to store information associated with the clock mesh, information associated with the plurality of clock buffers, information associated with the H-tree, information associated with the reconfigured particular clock buffer, and the location information associated with the plurality of components.

20. The system of claim 19, where the one or more user devices further comprise:
   logic to determine an input impedance of the H-tree interconnected with the one or more components,
   logic to determine buffering characteristics to drive the H-tree and the one or more components to which the H-tree is connected based on the input impedance of the H-tree, and
   logic to reconfigure the particular clock buffer based on the determination of the buffering characteristics.

\* \* \* \* \*